(12) United States Patent
Dabbaugh et al.

(10) Patent No.: US 6,362,094 B1
(45) Date of Patent: Mar. 26, 2002

(54) HYDROGENATED SILICON CARBIDE AS A LINER FOR SELF-ALIGNING CONTACT VIAS

(75) Inventors: Gary Dabbaugh, Berkeley Heights, NJ (US); Gerald W. Gibson, Jr., Orlando, FL (US); Troy A. Giniecki, Bethlehem, PA (US); Kurt G. Steiner, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/640,329

(22) Filed: Aug. 16, 2000

(51) Int. Cl.[7] .......................................... H01L 21/4763
(52) U.S. Cl. ...................................... 438/637; 438/765
(58) Field of Search ................................ 438/765, 623, 438/637; 257/347, 358

(56) References Cited

U.S. PATENT DOCUMENTS

| 5,859,458 A | * | 1/1999 | Hsueh et al. ................ 257/347 |
| 6,054,379 A | * | 4/2000 | Yau et al. .................... 438/623 |
| 6,066,555 A | * | 5/2000 | Nulty et al. ................. 438/634 |

* cited by examiner

Primary Examiner—David Nelms
Assistant Examiner—David Vu

(57) ABSTRACT

The present invention provides a method of fabricating a self-aligning contact opening comprising: (a) forming a dielectric layer over a semiconductor substrate and gate electrodes located on the semiconductor substrate, (b) forming a carbide liner over the dielectric layer, and (c) etching at least a portion the carbide liner to form a self-aligning contact opening between the gate electrodes.

14 Claims, 5 Drawing Sheets

HYDROGENATED SILICON CARBIDE AS A LINER FOR SELF-ALIGNING CONTACT VIAS

TECHNICAL FIELD OF THE INVENTION

The present invention is directed, in general, to semiconductor integrated circuit manufacturing and, more specifically, to a method of forming a liner of hydrogenated silicon carbide within a via prior to forming a self-aligned contact.

BACKGROUND OF THE INVENTION

In the highly competitive electronics marketplace of today, the functionality of most similar devices has become fairly similar. Therefore, more emphasis is being placed on the speed of a device as the standard by which competing electronics are measured. In general, to both private consumers and businesses alike, an electronic device is more desirable if the electronics, e.g., the processor(s), are faster than the competing electronics.

Many approaches to increasing the speed of an integrated circuit have been tried. Among successful areas of research has been the relatively recent disclosure of the ability to use copper as a conductor in place of aluminum. Until fairly recently, most integrated circuits were constrained to the use of aluminum and tungsten as contacts or interconnects. However, due to the advancements in processing, copper is quickly becoming a highly desirable metal to use in integrated electronics. Additionally, copper, which is significantly faster as a conductor than aluminum, is also relatively inexpensive. Therefore, the search for other approaches to increase speed is now consistently focused on decreasing inter-device distances to increase the integrated circuit operating speed in general. One such approach is to drive the integrated circuits to a higher device density in an effort to increase the operating speed. Today, with feature sizes approaching 0.12 $\mu$m, every factor is being examined to increase operating speed.

Forming self-aligned contacts (SACs) between the active devices and the interconnect levels is one of the approaches being used to achieve higher device densities. SACs are formed by exploiting the etch selectivity between either undoped, boron-doped, phosphorus-doped, or boron and phosphorous-doped oxides and silicon nitride (SiN). That is, a via is formed in the layers using selective etches over the intended contact point and then filled with conductive metal.

However, SAC processes using the conventional materials listed above are becoming much less useful as the device sizes approach 0.12 $\mu$m. At these device sizes, high density plasma dielectrics are required to fill more aggressive aspect ratio gaps, that, in turn, have less selectivity to the silicon nitride liner material. Furthermore, the relatively high dielectric constant of the silicon nitride liner poses a concern over increased parasitic capacitance. Also, the relatively high dielectric constant of the SiN liner poses concern for increased parasitic capacitance in the resultant device. Some attempts have been made to improve etch selectivity by increasing the dopant levels or using lower density fill materials, such as ozone reacted oxides. However, the higher dopant concentration and porous fill materials are inherently unstable.

Accordingly, what is needed in the art is an improved method for forming self-aligned contacts in vias of integrated circuits that do not suffer from the deficiencies of the prior art.

SUMMARY OF THE INVENTION

To address the above-discussed deficiencies of the prior art, the present invention provides, in one embodiment, a method of fabricating a self-aligning contact opening comprising: (a) forming a dielectric layer over a semiconductor substrate and gate electrodes located on the semiconductor substrate, (b) forming a carbide liner over the dielectric layer, and (c) etching at least a portion the carbide liner to form a self-aligning contact opening between the gate electrodes.

In an alternative embodiment, forming a carbide liner includes forming a hydrogenated silicon carbide liner. The step of forming a carbide liner may include forming a carbide liner with a chemistry including methyl silane, dimethyl silane, trimethyl silane, or tetramethyl silane. Alternatively, the carbide liner may be formed with a chemistry including oxygen in the form of nitrous oxide, carbon dioxide, or oxygen. An alternative chemistry may include methane, butane and acetylene.

Different embodiments may include Various processing parameters, such as temperature, pressure and radio frequency (rf) power. For example in one embodiment the carbide liner may be formed at a temperature ranging from about 250° C. to about 400° C. In a related embodiment, forming a carbide liner includes forming a carbide liner at a pressure ranging from about 2.5 Torr to about 10.0 Torr. In another embodiment, the method may include forming a carbide liner at an rf power ranging from about 200 W to about 600 W at about 13.56 MHz.

In yet another embodiment, the method may further comprise forming an oxide layer over the carbide liner and etching at least a portion of each of the oxide layer and the carbide liner. In a related embodiment, the method includes etching with an etch comprising an appropriate mixture of fluorocarbons, hydrofluorocarbons, oxygen, and diluent (e.g., Ar, N2, etc.). Moreover, the mixture may contain any combination of these gases.

The method may include etching with a first chemistry that is selective to the carbide liner as compared with the dielectric layer. In a further aspect of this embodiment, the method may further include etching with a second chemistry that is selective to the carbide liner as compared with the oxide liner. In a particular aspect of this embodiment, etching with a second chemistry includes etching with an etch comprising an appropriate mixture of fluorocarbons, hydrofluorocarbons, oxygen, and diluent (e.g., Ar, N2, etc.). In an advantageous embodiment, the amount of oxygen and/or nitrogen may be higher than the first chemistry disclosed above. In yet another embodiment, the method further comprises removing a portion of the dielectric layer.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
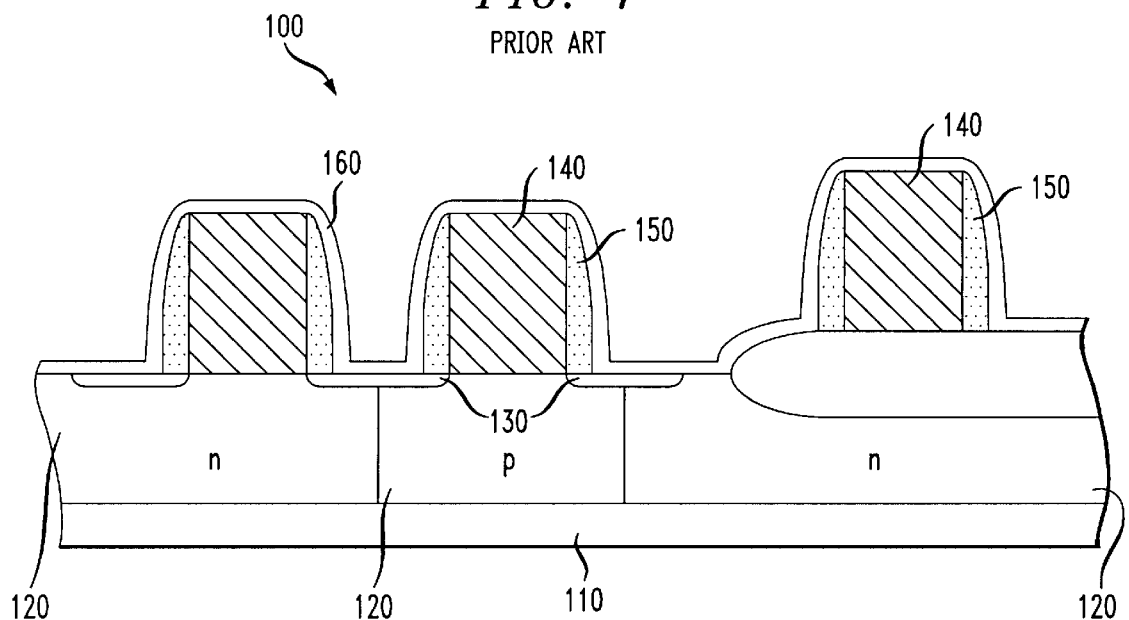
FIG. 1 illustrates a sectional view of one embodiment of a conventional integrated circuit formed on a substrate at an intermediate stage of manufacture.

Referring initially to FIG. 1, illustrated is a sectional view of one embodiment of a conventional integrated circuit 100 formed on a substrate 110 at an intermediate stage of manufacture. At this stage of manufacture, the conventional integrated circuit 100 has been partially formed and comprises the substrate 110, tub regions 120, source/drain regions 130, gate electrodes 140, spacers 150, and a thin oxide liner 160, all of which form an active region of the integrated circuit 100. The methods for forming these various components of an integrated circuit are conventional techniques and are well known to one who is skilled in the art.

Figure 2:
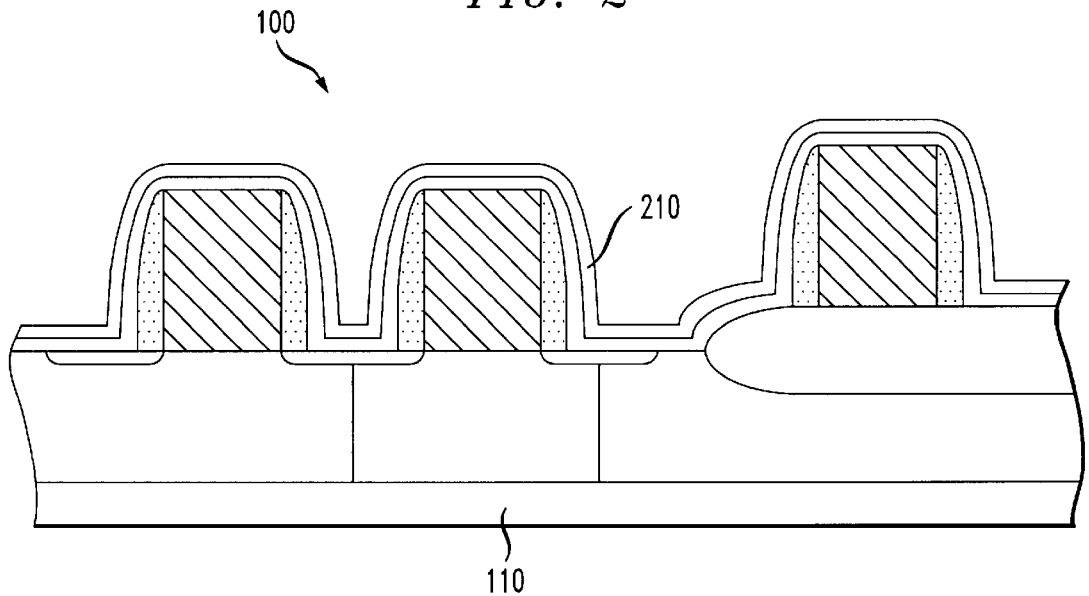
FIG. 2 illustrates a sectional view of the conventional integrated circuit of FIG. 1 having a silicon carbide liner formed over the active regions in accordance with the principles of the present invention.

Referring now to FIG. 2, illustrated is a sectional view of the conventional integrated circuit of FIG. 1 having a hydrogenated silicon carbide liner 210 formed over the active regions in accordance with the principles of the present invention. In this particularly advantageous embodiment, the hydrogenated carbide liner's 210 thickness may range from about 50 nm to about 100 nm. The hydrogenated silicon carbide liner 210 may be formed in a conventional plasma-enhanced chemical vapor deposition (PECVD) reactor using a chemistry of methyl silane ($CH_3SiH_3$ and nitrous oxide ($N_2O$) at a temperature ranging from about 250° C. to about 400° C. Power required for the formation of the carbide liner 210 may range from about 200 Watts to about 600 Watts at a radio frequency of about 13.56 MHz and a pressure ranging from about 2.5 Torr to about 10.0 Torr.

Alternatively, the hydrogenated silicon carbide liner 210 may be formed using chemistries including silane other chemical forms such as: dimethyl silane, trimethyl silane, or tetramethyl silane. Also, in a similar manner, oxygen may be provided in the form of carbon dioxide, or oxygen. An alternative chemistry may include methane, butane or acetylene. It should be noted that conventional stoichiometric silicon carbide is a semiconductor and, would not be suitable for this application. In an advantageous embodiment, the hydrogenated silicon carbide may be formed by doping silicon carbide with hydrogen ranging from about 10 atomic percent to about 20 atomic percent. In such embodiments, the resulting hydrogenated silicon carbide has a dielectric constant ranging from about 4.5 to about 5.5, thereby providing a significant improvement over the conventional silicon nitride.

Figure 3:
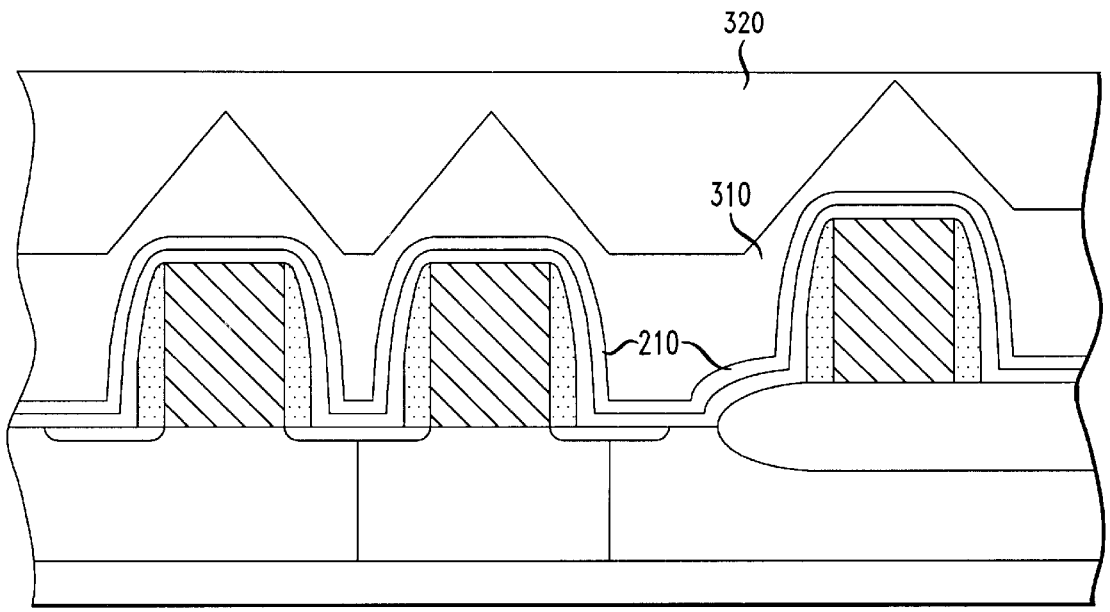
FIG. 3 illustrates a sectional view of the integrated circuit of FIG. 2 having two dielectric layers deposited over the silicon carbide liner.

Referring now to FIG. 3, illustrated is a sectional view of the integrated circuit of FIG. 2 having two dielectric layers 310, 320 deposited over the silicon carbide liner 210. The first dielectric layer 310 may be an undoped oxide layer 310 comprising silicate glass formed using a conventional high density plasma. The second dielectric layer 320 may be a phosphorous silicate glass (PSG) 320 layer formed by conventional plasma-enhanced chemical vapor deposition.

Figure 4:
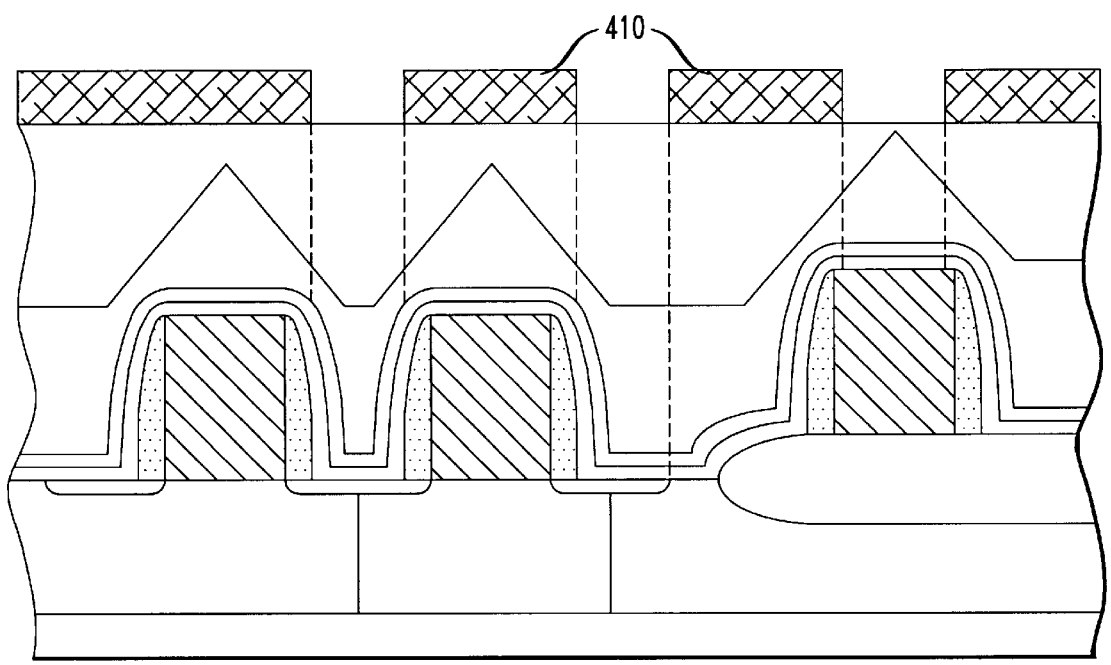
FIG. 4 illustrates a sectional view of the integrated circuit of FIG. 3 after conventional deposition and window printing of a photoresist layer over the second dielectric layer.

Referring now to FIG. 4, illustrated is a sectional view of the integrated circuit of FIG. 3 after conventional deposition and patterning of a photoresist layer 410 over the second dielectric layer 320. The photoresist layer 410 may be exposed with conventional deep ultra violet lithography techniques.

Figure 5:
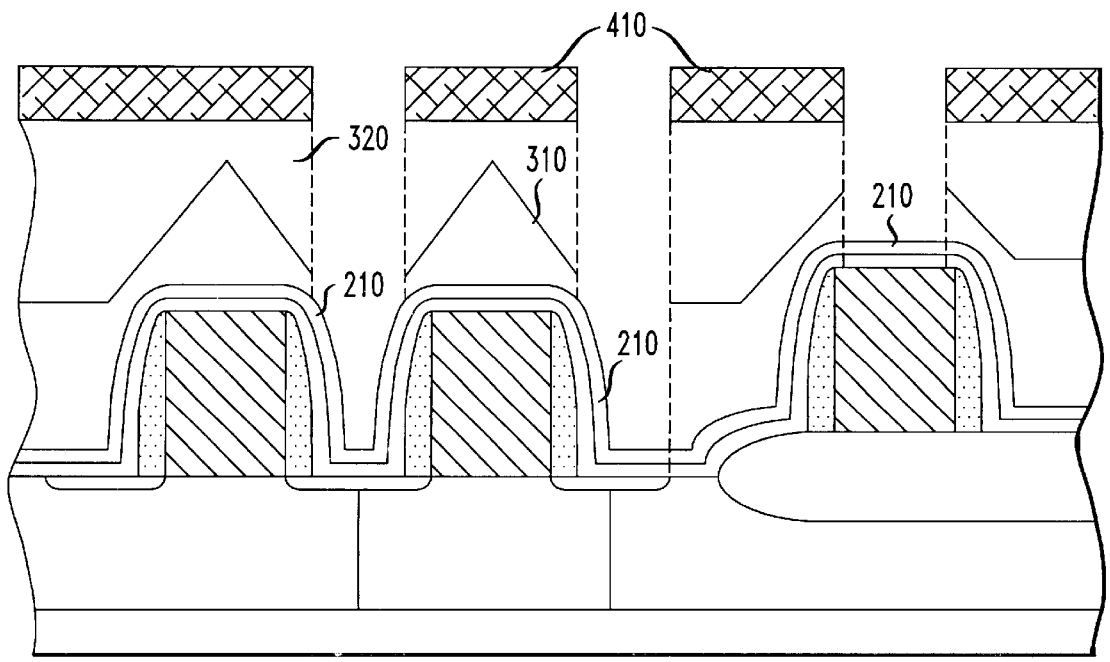
FIG. 5 illustrates a sectional view of the integrated circuit of FIG. 4 after etching with a first reactive ion etch.

Referring now to FIG. 5, illustrated is a sectional view of the integrated circuit of FIG. 4 after etching with a first reactive ion etch. The first reactive ion etch may be performed in a plasma reactor with a chemistry that etches oxide, e.g., the first and second dielectric layers 310, 320 selective to both the photoresist layer 410 and the silicon carbide liner 210. The first reactive ion etch comprises an appropriate mixture of fluorocarbons, hydro fluorocarbons, oxygen, and diluent (e.g., Ar, N2, etc.). Moreover, the mixture may contain any combination of these gases.

Figure 6:
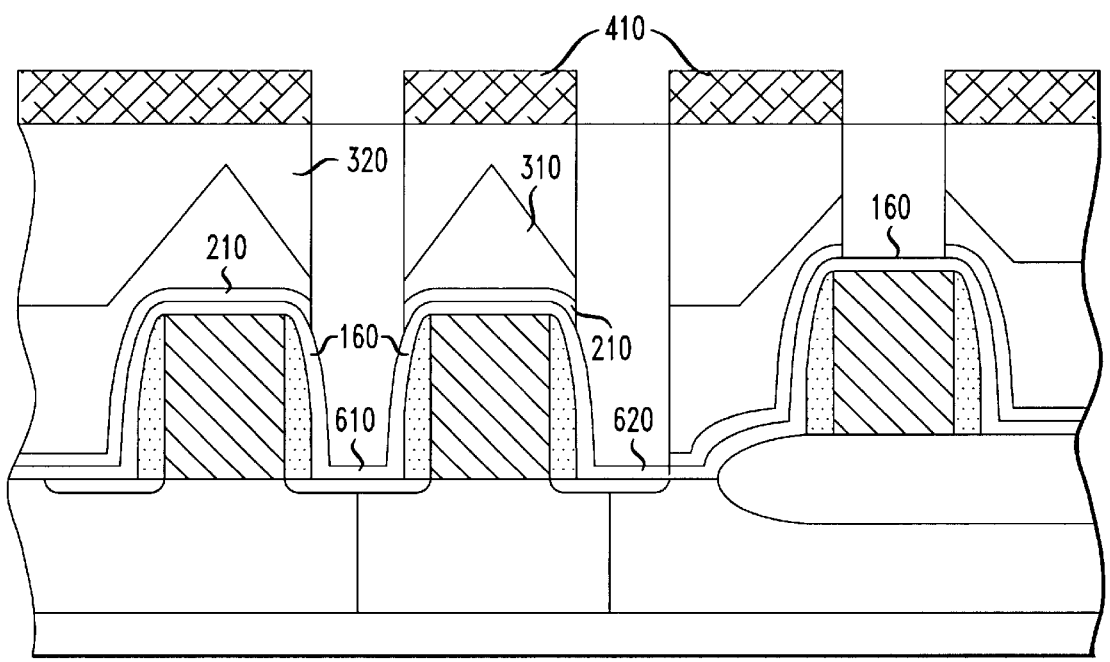
FIG. 6 illustrates a sectional view of the integrated circuit of FIG. 5 after etching with a second reactive ion etch.

Referring now to FIG. 6, illustrated is a sectional view of the integrated circuit of FIG. 5 after etching with a second reactive ion etch. When the first reactive ion etch stops at the silicon carbide liner 210, the etch chemistry is changed to a second reactive ion etch comprising an appropriate mixture of fluorocarbons, hydrofluorocarbons, oxygen, and diluent (e.g., Ar, N2, etc.). In an advantageous embodiment, the amount of oxygen and/or nitrogen may be higher than the first chemistry disclosed above. The second reactive ion etch is selective to the silicon carbide liner 210 over the photoresist layer 410. The second reactive ion etching is stopped when the thin oxide liner 160 is reached, leaving oxide areas 610, 620.

Figure 7:
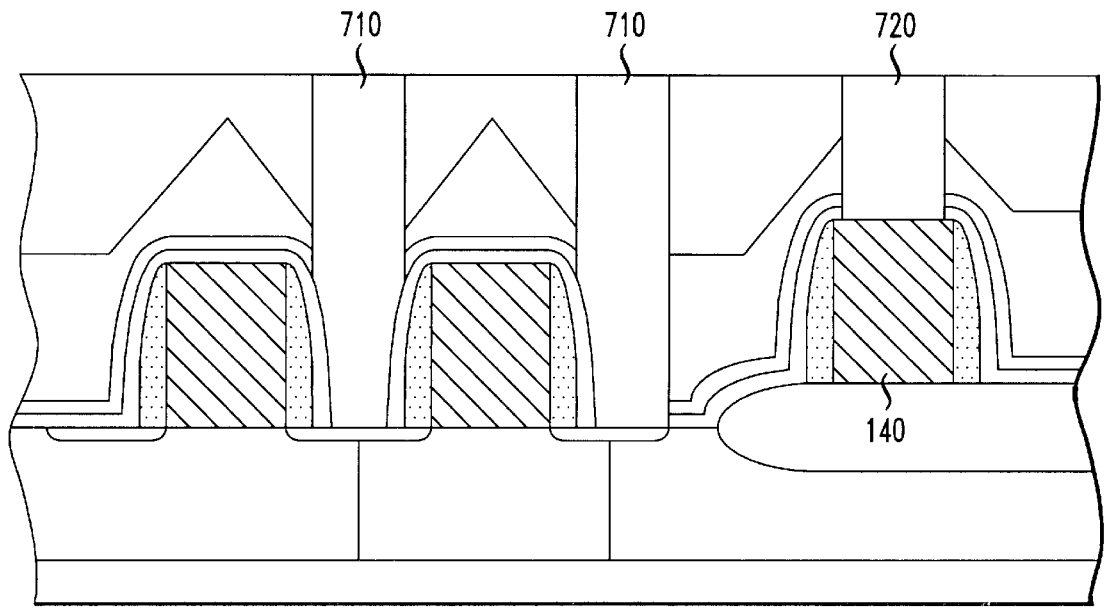
FIG. 7 illustrates a sectional view of the integrated circuit of FIG. 6 after removal of the photoresist layer and the oxide areas.

Referring now to FIG. 7 with continuing reference to FIG. 6, illustrated is a sectional view of the integrated circuit of FIG. 6 after removal of the photoresist layer 410 and the oxide areas 610. The photoresist layer 410 may be removed by conventional methods well known to those who are skilled in the art. The oxide areas 610 may be removed in situ with a conventional light oxide etch, or with a sodium removal etch after the photoresist layer 410 is stripped. Removal of the oxide layers 610 completes the formation of self-aligning contact openings 710 in the dielectric layers 310, 320. Also formed is a conventional contact opening 720 formed in contact with the gate electrode 140.

Figure 8:
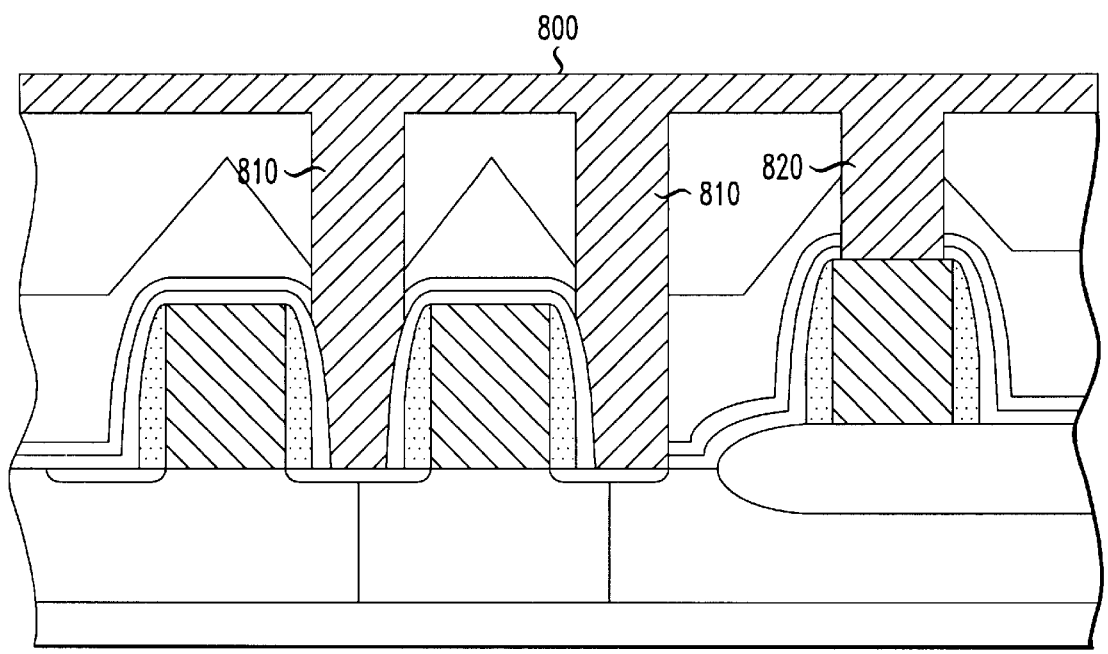
FIG. 8 illustrates a sectional view of the integrated circuit of FIG. 7 after conventional filling of self-aligning contact openings and conventional contact opening.

Referring now to FIG. 8 with continuing reference to FIG. 7, illustrated is a sectional view of the integrated circuit of FIG. 7 after conventional filling of self-aligning contact openings 710 and conventional contact opening 720. Using conventional methods, the self-aligning contact openings 710 and conventional contact opening 720 are filled with a conductive metal 800, e.g., tungsten, copper, or aluminum, forming self-aligned contacts 810 and conventional contact 820. One who is skilled in the art is familiar with the formation of contact plugs 810, 820 comprising metals such as tungsten. Of course, some or all of the metal 800 will ultimately be removed with chemical/mechanical polishing to prepare a surface for further depositions.

Figure 9:
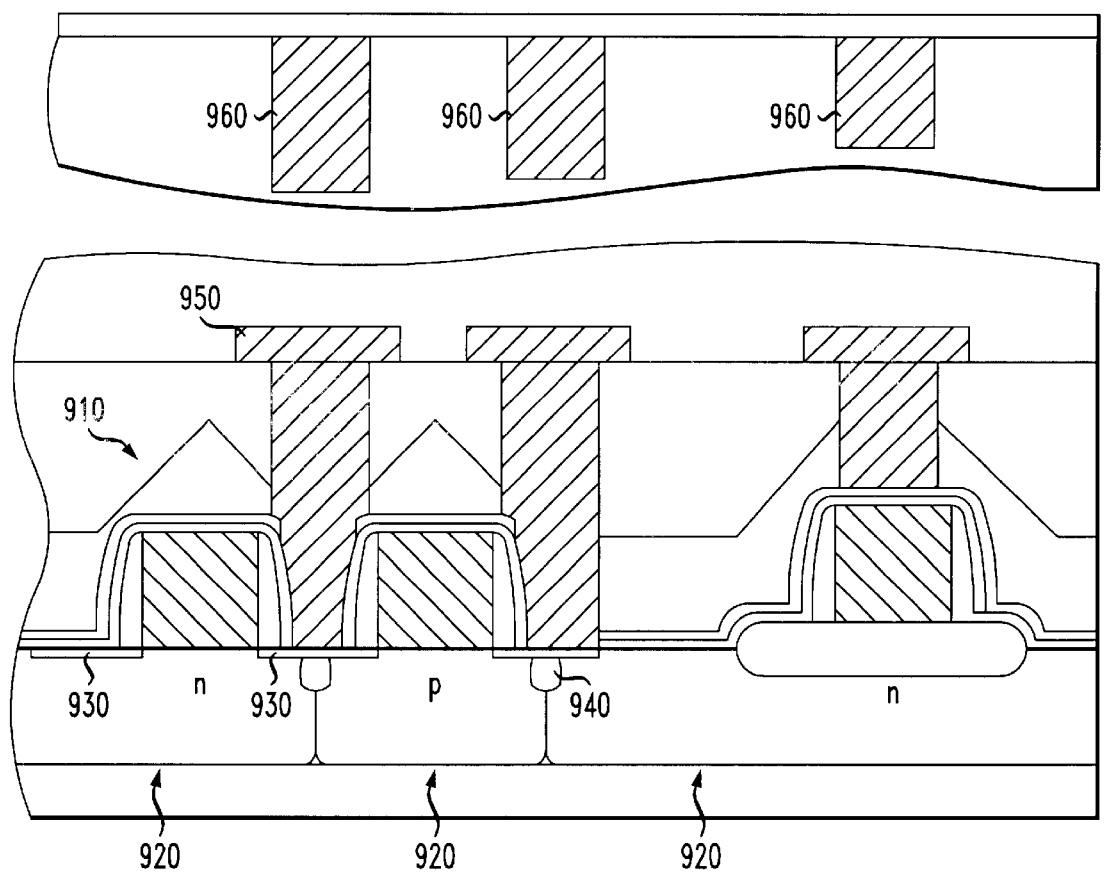
FIG. 9 illustrates a sectional view of a conventional integrated circuit that can be manufactured using the principles of the present invention.

Referring now to FIG. 9, illustrated is a sectional view of a conventional integrated circuit 900 that can be manufactured using the principles of the present invention. In this particular to sectional view, there is illustrated an active device 910 that comprises tub regions 920, source/drain regions 930 and field oxides 940, which together may form a conventional transistor, such as a CMOS, PMOS, NMOS or bi-polar device transistor. A contact plug 950 contacts the active device 910. The contact plug 950 is, in turn, contacted by a trace 960 that connects to other regions of the integrated circuit 900, all of which are not shown. Those who are skilled in the art are very familiar with such transistor devices in both structure and methods of fabrication thereof with the exception of the structural and method components presented by the present invention.

Thus, a method of integrated circuit fabrication has been described that employs the formation of a hydrogenated silicon carbide liner so that a two-phase selective etch process may be used to form self-aligning contact openings in the layers of a semiconductor device.

Although the present invention has been described in detail, those skilled in the art should understand that they can make various changes, substitutions and alterations herein without departing from the spirit and scope of the invention in its broadest form.

What is claimed is:

1. A method of fabricating a self-aligning contact opening, comprising:

forming a dielectric layer over and between gate electrodes located on a semiconductor substrate;

forming a carbide liner over the dielectric layer; and etching at least a portion of the carbide liner that leaves the dielectric layer between the gate electrodes and forms a self-aligning contact opening between the gate electrodes.

2. The method as recited in claim 1 wherein forming a carbide liner includes forming a hydrogenated silicon carbide liner.

3. The method as recited in claim 1 wherein forming a carbide liner includes forming a carbide liner with a chemistry including a silane selected from the group consisting of:

methyl silane;

dimethyl silane;

trimethyl silane; and tetramethyl silane.

4. The method as recited in claim 1 wherein forming a carbide liner includes forming a carbide liner with a chemistry including oxygen in a form selected from the group consisting of:

nitrous oxide;

carbon dioxide; and oxygen.

5. The method as recited in claim 1 wherein forming a carbide liner includes forming a carbide liner at a temperature ranging from about 250° C. to about 400° C.

6. The method as recited in claim 1 wherein forming a carbide liner includes forming a carbide liner at a pressure ranging from about 2.5 Torr to about 10.0 Torr.

7. The method as recited in claim 1 wherein forming a carbide liner includes forming a carbide liner at an rf power ranging from about 200 W to about 600 W at about 13.56 MHz.

8. The method as recited in claim 1 further comprising forming an oxide layer over the carbide liner and etching includes etching at least a portion of each of the oxide layer and the carbide liner.

9. The method as recited in claim 1 wherein etching includes etching with an etch comprising an appropriate mixture of fluorocarbons, hydro fluorocarbons, oxygen, and diluent.

10. The method as recited in claim 1 wherein etching includes etching with a first chemistry that is selective to the carbide liner as compared with the dielectric layer.

11. The method as recited in claim 10 wherein etching further includes etching with a second chemistry that is selective to the carbide liner as compared with the oxide liner.

12. The method as recited in claim 11 wherein etching with a second chemistry includes etching with an etch comprising an appropriate mixture of fluorocarbons, hydro fluorocarbons, oxygen, and diluent.

13. The method as recited in claim 1 further comprising removing a portion of the dielectric layer.

14. The method as recited in claim 3 wherein forming a carbide liner includes forming a carbide liner with a chemistry further including a hydrocarbon selected from the group consisting of:

butane;

methane; and acetylene.

* * * * *